US010832765B2

(12) United States Patent
Fujiwara et al.

(10) Patent No.: US 10,832,765 B2
(45) Date of Patent: Nov. 10, 2020

(54) VARIATION TOLERANT READ ASSIST CIRCUIT FOR SRAM

(71) Applicant: Taiwan Semiconductor Manufacturing Co., Ltd., Hsinchu (TW)

(72) Inventors: Hidehiro Fujiwara, Hsin-chu (TW); Hung-Jen Liao, Hsin-chu (TW); Hsien-Yu Pan, Hsinchu (TW); Chih-Yu Lin, Taichung (TW); Yen-Huei Chen, Hsinchu County (TW); Sahil Preet Singh, Hsinchu (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 0 days.

(21) Appl. No.: 16/376,640

(22) Filed: Apr. 5, 2019

(65) Prior Publication Data

US 2020/0005858 A1 Jan. 2, 2020

Related U.S. Application Data

(60) Provisional application No. 62/692,104, filed on Jun. 29, 2018.

(51) Int. Cl.
*G11C 11/419* (2006.01)
*G11C 11/412* (2006.01)

(52) U.S. Cl.
CPC .......... *G11C 11/419* (2013.01); *G11C 11/412* (2013.01)

(58) Field of Classification Search
CPC ................. G11C 5/14; G11C 11/419

(Continued)

(56) References Cited

U.S. PATENT DOCUMENTS 6,493,266 B1 * 12/2002 Yachareni .......... G11C 16/3404
365/185.22
6,525,896 B2 * 2/2003 Chung ................. H03K 17/102
327/110

(Continued)

OTHER PUBLICATIONS

K. Nii et., A 45-nm Single-port and Dual-part SRAM family with Robust Read/Write Stabilizing Circuitry under DVFS Environment.

*Primary Examiner* — Michael T Tran
(74) *Attorney, Agent, or Firm* — Sterne, Kessler, Goldstein & Fox P.L.L.C.

(57) ABSTRACT

A read assist circuit is disclosed that selectively provides read assistance to a number of memory cells during a read operation of the number of memory cells. The read assist circuit includes a voltage divider circuit and a number of write line driver circuits. The voltage divider circuit is configured to voltage-divide a power supply voltage and provide a source write line voltage at an output of the voltage divider circuit to the number of write line driver circuits. Each write line driver circuit is configured to receive the source write line voltage and selectively apply the source write line voltage to a corresponding write line according to a corresponding individual enable signal that controls each write driver circuit. Further, each write line driver circuit is coupled to a corresponding memory cell of the number of memory cells via the corresponding write line so that the corresponding write line provides a corresponding write line voltage to provide read assistance during the read operation.

21 Claims, 7 Drawing Sheets

(58) Field of Classification Search
USPC .................................................. 365/156, 226
See application file for complete search history.

(56) References Cited

U.S. PATENT DOCUMENTS

| | | | | |
|---|---|---|---|---|
| 6,768,160 B1* | 7/2004 | Li | ................... | G11C 16/0466 |
| | | | | 257/285 |
| 7,085,190 B2* | 8/2006 | Worley | ................... | G11C 8/08 |
| | | | | 365/189.11 |
| 9,875,783 B2* | 1/2018 | Dray | ................... | G11C 8/08 |
| 2004/0066683 A1* | 4/2004 | Hartmann | ................... | G11C 29/02 |
| | | | | 365/200 |
| 2004/0105312 A1* | 6/2004 | He | ................... | G11C 7/12 |
| | | | | 365/185.25 |
| 2005/0077567 A1* | 4/2005 | Randolph | ................... | G11C 16/0483 |
| | | | | 257/315 |
| 2006/0044923 A1* | 3/2006 | Hahn | ................... | G11C 8/08 |
| | | | | 365/230.06 |
| 2006/0227613 A1* | 10/2006 | Joo | ................... | G11C 16/12 |
| | | | | 365/185.18 |
| 2006/0279994 A1* | 12/2006 | Park | ................... | G11C 16/3404 |
| | | | | 365/185.18 |
| 2007/0097733 A1* | 5/2007 | Perner | ................... | G11C 11/16 |
| | | | | 365/158 |
| 2007/0183205 A1* | 8/2007 | Lee | ................... | G11C 16/30 |
| | | | | 365/185.18 |
| 2008/0055991 A1* | 3/2008 | Kim | ................... | G11C 16/0483 |
| | | | | 365/185.11 |
| 2010/0259974 A1* | 10/2010 | Shin | ................... | G11C 5/147 |
| | | | | 365/163 |
| 2011/0242879 A1* | 10/2011 | Mair et al. | ................... | G11C 11/412 |
| | | | | 365/154 |
| 2012/0075938 A1* | 3/2012 | Kolar | ................... | G11C 11/419 |
| | | | | 365/189.14 |
| 2012/0146601 A1 | 6/2012 | Liu | | |
| 2012/0307547 A1* | 12/2012 | Park | ................... | G11C 13/00 |
| | | | | 365/148 |
| 2013/0027081 A1* | 1/2013 | Nazarian | ................... | H03K 19/17764 |
| | | | | 326/44 |
| 2013/0250657 A1* | 9/2013 | Haukness | ................... | G11C 13/0069 |
| | | | | 365/148 |
| 2013/0308374 A1* | 11/2013 | Gogl | ................... | G11C 11/1675 |
| | | | | 365/158 |
| 2014/0233328 A1* | 8/2014 | Ito | ................... | G11C 7/20 |
| | | | | 365/189.09 |
| 2014/0233330 A1* | 8/2014 | Ko | ................... | G11C 11/419 |
| | | | | 365/189.16 |
| 2015/0310930 A1* | 10/2015 | Boldt | ................... | G11C 17/18 |
| | | | | 324/550 |
| 2016/0125927 A1* | 5/2016 | Wei | ................... | G11C 11/1693 |
| | | | | 365/148 |
| 2017/0200508 A1* | 7/2017 | Grigoriev | ................... | G11C 7/24 |
| 2017/0243622 A1* | 8/2017 | Sandhu | ................... | G11C 7/062 |
| 2017/0287556 A1* | 10/2017 | Sandhu | ................... | G11C 13/004 |
| 2017/0337962 A1* | 11/2017 | Bayram | ................... | G11C 11/404 |
| 2018/0158524 A1* | 6/2018 | Shin | ................... | G11C 13/0033 |
| 2018/0174646 A1 | 6/2018 | Luo et al. | | |
| 2018/0197608 A1* | 7/2018 | Song | ................... | G11C 16/08 |
| 2018/0268898 A1* | 9/2018 | Suzuki | ................... | G11C 11/1693 |
| 2018/0277186 A1* | 9/2018 | Hatsuda | ................... | G11C 11/1693 |
| 2018/0277206 A1* | 9/2018 | Park | ................... | G11C 13/0038 |
| 2019/0006019 A1* | 1/2019 | Wang | ................... | G11C 29/025 |
| 2019/0043573 A1* | 2/2019 | Buchanan | ................... | G11C 13/0028 |
| 2019/0392898 A1* | 12/2019 | Haukness | ................... | G11C 7/08 |
| 2020/0168275 A1* | 5/2020 | Bai | ................... | H03K 19/1776 |

* cited by examiner

VARIATION TOLERANT READ ASSIST CIRCUIT FOR SRAM

CROSS-REFERENCE TO RELATED APPLICATIONS

The present application claims the benefit of U.S. Provisional Patent Appl. No. 62/692,104, filed Jun. 29, 2018, which is incorporated herein by reference in its entirety.

BACKGROUND

A data storage device is an electronic device for writing and/or reading electronic data. The data storage device can be implemented as volatile memory, such as random-access memory (RAM), which conventionally requires power to maintain its stored information or non-volatile memory, such as read-only memory (ROM), which can maintain its stored information even when not powered. RAM can be implemented in a dynamic random-access memory (DRAM), a static random-access memory (SRAM), and/or a non-volatile random-access memory (NVRAM), often referred to as a flash memory, configuration.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is does not in itself dictate a relationship between the various embodiments and/or configurations discussed.

Overview

A static random-access memory (SRAM) includes a bi-stable latch that uses feedback to store a logic state (e.g. "0" or "1"). During a "write operation", when the current logic state is to be changed (from "0" or "1," or vice versa), the newly desired logic state is applied to the "bit-line," while the "write-line" is enabled to store the logic state to the bi-stable latch. During a "read operation", the write line is again enabled to read the logic state stored in the bi-stable latch on the bit line. A read assist circuit is provided herein to generate the write line voltage necessary to enable the write line during the read operation. The read assist circuit provided herein provides a write line source voltage that can be shared with several write line driver circuits that are enabled by their own corresponding separate enable signals so as to selectively provide read assist write line voltages to corresponding memory cells during the read operation. Further, the write line source voltage has minimal variation and therefore is sufficiently stable.

Exemplary Read Assist Circuits

Figure 1A:
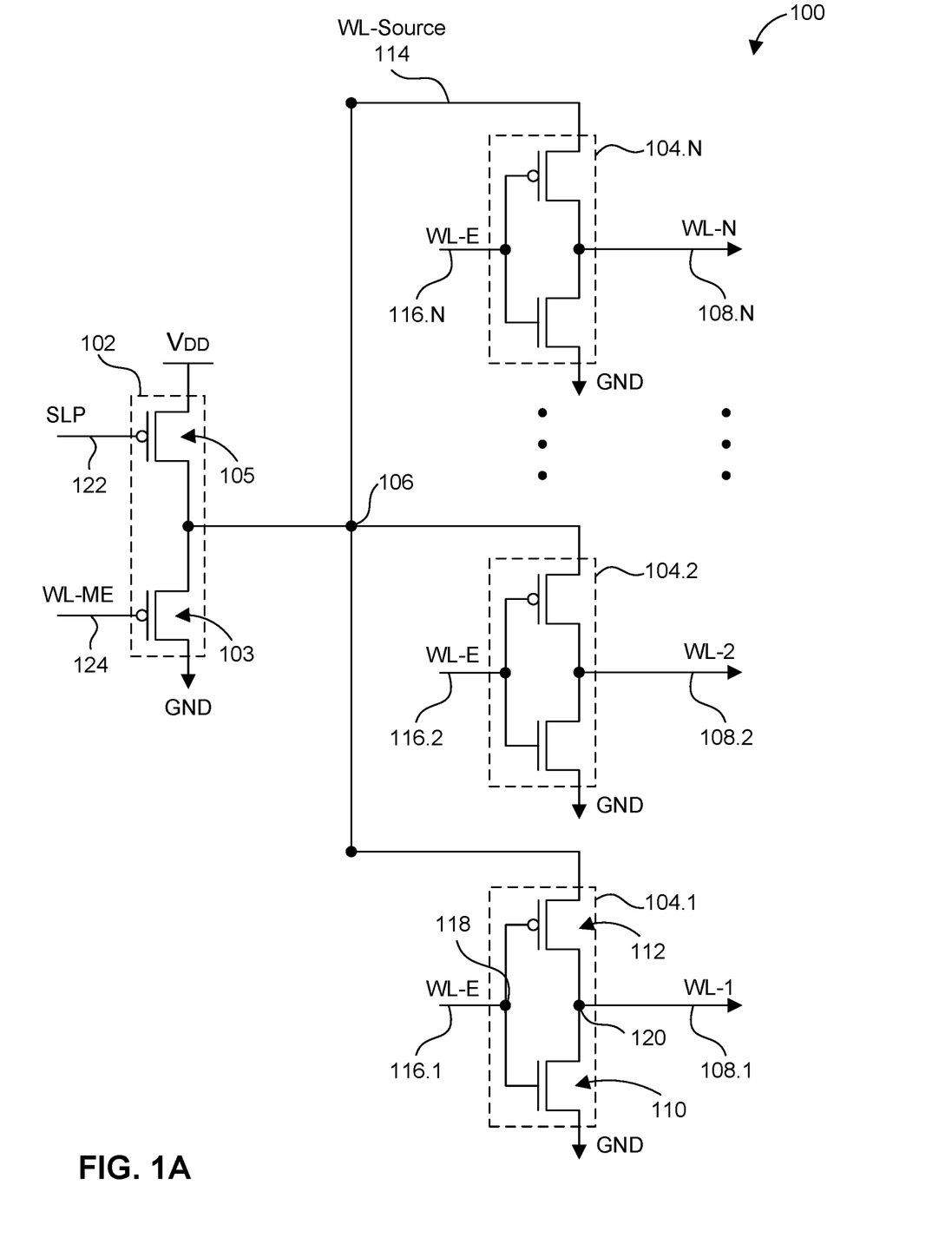
FIG. 1A illustrates a read assist circuit according to an exemplary embodiment of the present disclosure.

FIG. 1A illustrates read assist circuit 100 according to embodiments of the present disclosure. The read assist circuit 100 generates a number of write line voltages WL-1 to WL-N that can be applied to corresponding write lines of associated memory devices, such as an SRAM device. Read assist circuit 100 includes voltage divider circuit 102 and a number of write line driver circuits 104.1-104.N, which generate the write line voltages WL-1 to WL-N. The voltage divider circuit 102 includes PMOS transistors 103 and 105 that are connected in a cascode configuration. More specifically, the source of PMOS transistor 103 is connected to the drain of PMOS transistor 105 at node 106. The source of PMOS transistor 105 is connected to the power supply $V_{DD}$ and the drain of PMOS transistor 103 is connected to ground. Other voltage divider circuits are within the scope and spirit of the present disclosure, as will be understood by those skilled in the art based on the discussion provided herein. The voltage at node 106 (between PMOS transistors 103 and 105) defines a source write line voltage 114 that is available to be applied by the individual write line driver circuits 104.1-104.N to their corresponding write lines 108.1-108.N, as shown. The individual write line driver circuits 104.1-104.N are each implemented as inverters according to embodiments of the disclosure. For example, write line driver circuit 104.1 includes an NMOS transistor 110 that is cascode-connected with PMOS transistor 112 to provide the inverter configuration.

During operation, voltage divider circuit 102 is responsive to two input control signals, namely, a sleep control signal 122 and a master enable signal 124. The sleep control signal 122 is applied at the gate of PMOS transistor 105 and generally kept at a logic low so that PMOS transistor 105 is generally conducting (e.g. "on"), unless the read assist circuit 100 is in a "sleep mode". During "sleep mode," sleep control signal 122 is raised to a "logic high" so that PMOS transistor 105 is cutoff. The master enable signal 124 is applied to the gate of PMOS transistor 103 and is set to a logic low to enable read assist for the write lines 108.1-108.N, where the logic low causes the PMOS transistor 103 to conduct (e.g., "on"). When read assist is enabled, the PMOS transistors 103 and 105 operate to voltage-divide the supply voltage $V_{DD}$ according to the relative resistivity of the PMOS transistors 103 and 105, so that the source write line voltage 114 at node 106 is a percentage of the supply voltage $V_{DD}$. The individual write line driver circuits 104.1-

104.N then selectively apply the source write line voltage 114 to their individual write lines 108.1-108.N as controlled by their corresponding individual enable signals 116.1-116.N.

Write line driver circuits 104.1-104.N are implemented as inverters, responsive to corresponding individual enable signals 116.1-116.N as shown. Accordingly, the read assist is individually controllable for each memory cell that can be attached to the corresponding write lines 108.1-108.N. Write line driver circuit 104.1 (e.g. driver circuit 104.1), for example, includes an input 118 and an output 120, where the input 118 receives the individual enable signal 116.1, and the output 120 is connected to the write line 108.1 to provide a read assist write line voltage WL-1 to a corresponding memory cell attached to write line 108.1. The read assist is activated for the corresponding memory cell attached to write line 108.1 when the individual enable signal 116.1 is a logic low, which is inverted by the driver circuit 104.1 to provide a logic high at the output 120. The logic high voltage at the output 120 is supplied by the source write line voltage 114 that was generated by the voltage divider circuit 102 as described above. More specifically, when the individual enable signal 116.1 is logic low, then the PMOS transistor 112 conducts to apply the source write line voltage 114 to the output 120 and correspondingly to the write line 108.1. Additionally, the NMOS transistor 110 is cutoff when the enable signal 116.1 is a logic low to isolate the output 120 from ground. When the individual enable signal 116.1 is logic high, then PMOS transistor 112 is cutoff, so that the source write line voltage 114 is isolated from node 106, and NMOS transistor 110 is conducting so as to ground the output 120 and therefore disable read assistance. The additional write line driver circuits 104.2-104.N (e.g. "driver circuits" 104.1-104.N) have a similar configuration and operate in a similar fashion to driver circuit 104.1 as will be understood by those skilled in the arts.

As indicated above, the voltage divider circuit 102 generates the source write line voltage 114 that is applied to the individual write line driver circuits 104.1-104.N, where the source write line voltage 114 is a percentage of the supply voltage $V_{DD}$. In example embodiments of the disclosure, the source write line voltage 114 has substantially similar magnitude to the supply voltage $V_{DD}$, e.g. 90-95% of the supply voltage $V_{DD}$. As discussed above, the relative value of the source write line voltage 114 to the supply voltage $V_{DD}$ is determined by the relative resistivity of the PMOS transistors 103 and 105. Accordingly, the PMOS transistor 103 can be sized to be smaller than the PMOS transistor 105 so that most (e.g. 90-95%) of the voltage drop from $V_{DD}$ to ground occurs across PMOS transistor 103 when read assist is in operation. Accordingly, the PMOS transistor 103 has a first resistance that substantially larger than a second resistance of the PMOS transistor 105.

Figure 1B:
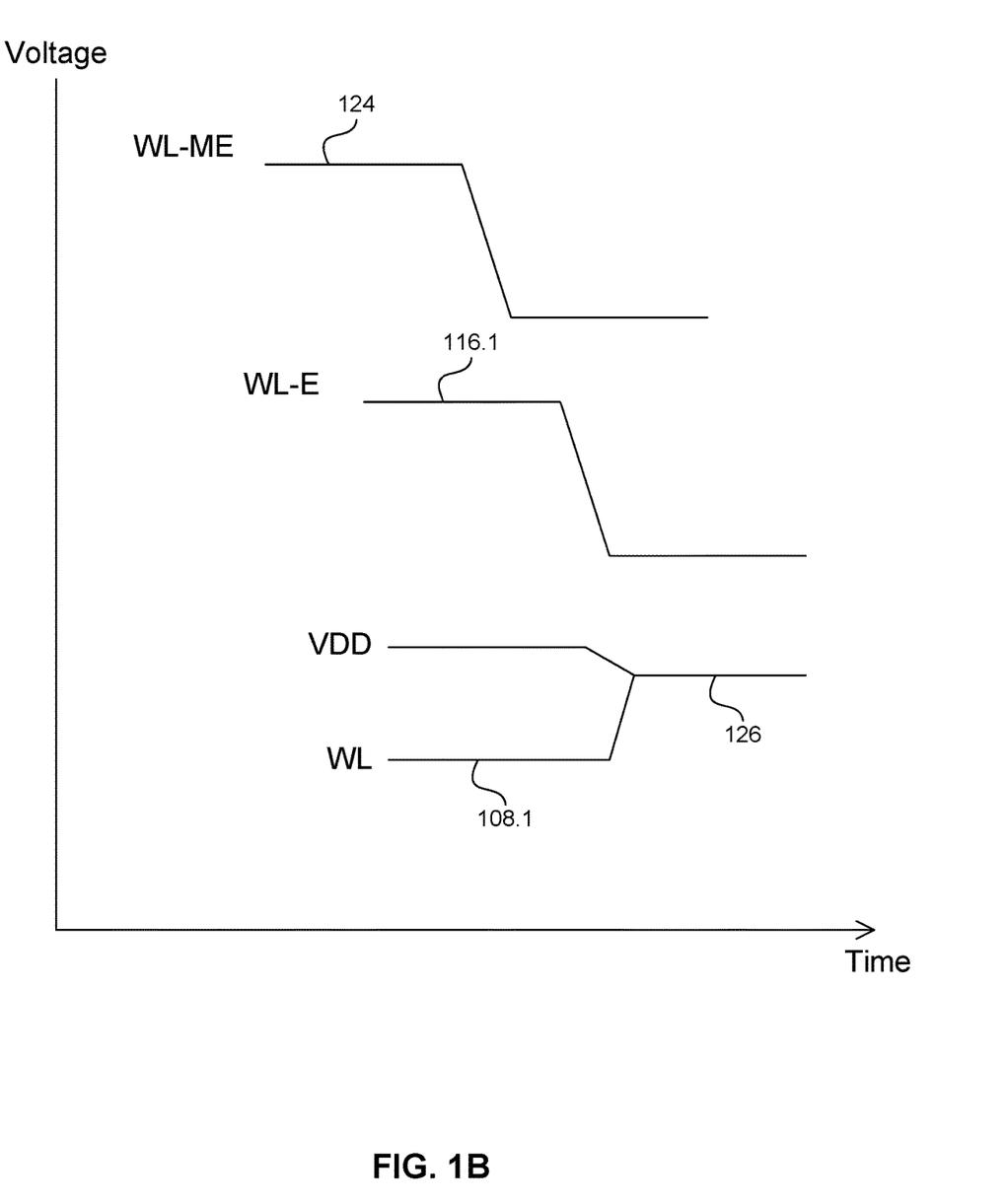
FIG. 1B illustrates various timing diagrams associated with the read assist circuit according to an exemplary embodiment of the present disclosure.

FIG. 1B illustrates timing diagrams for the various enable signals that enable read assistance for example write line 108.1 associated with write line driver 104.1, according to embodiments of the disclosure. As illustrated, master enable signal 124 transitions from a logic high to a logic low, prior to a similar transition by the individual enable signal 116.1 that controls driver circuit 104.1. This occurs so that the voltage divider circuit 102 generates the source write line voltage 114 prior the driver circuit 104.1 being triggered to provide the write voltage WL-1, which is sourced by the source write line voltage 114 as discussed above. As shown, once the individual enable signal 116.1 has transitioned to the logic low, the write line voltage on write line 108.1 transitions to a voltage 126 that is slightly below $V_{DD}$, for example, approximately 90-95% of $V_{DD}$.

Figure 2:
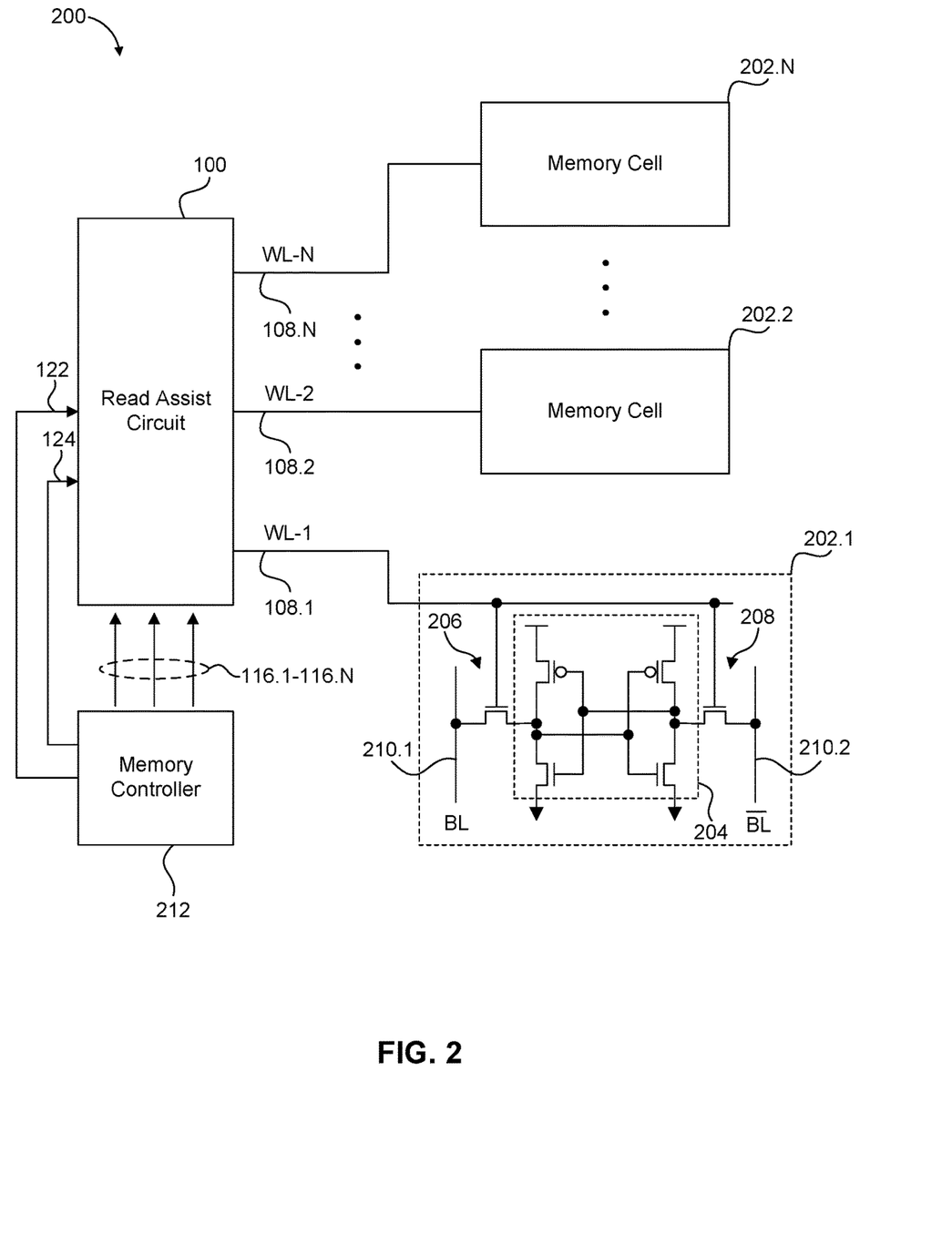
FIG. 2 illustrates a memory system including read assistance according to an exemplary embodiment of the present disclosure.

FIG. 2 illustrates a memory system 200 that incorporates read assistance according to embodiments of the present disclosure. Memory system 200 includes the read assist circuit 100 described in FIG. 1A and a number memory cells 202.1-202n that receive corresponding write line voltages WL-1 through WL-N via corresponding write lines 108.1-108.N. Accordingly, each of the memory cells 202.1-202.N receives its own corresponding write line voltage WL that may be selectively enabled for read assist. In embodiments, memory cells 202.1-202.N are SRAM memory cells. Further, memory system 200 includes a memory controller 212 that generates the sleep control signal 122, master enable signal 124, and the individual enable signals 116.1-116.N described above.

Example memory cell 202.1 includes a bi-stable latch 204, a first pass transistor 206 and a second pass transistor 208. The bi-stable latch 204 stores the logic state (e.g., "0", or "1") using a feedback mechanism that is well known to those skilled in the art, and therefore is not described further herein. The first pass transistor 206 and the second pass transistor 208 are NMOS transistors that selectively couple the bi-stable latch 204 to respective bitlines 210.1 and 210.2, so that the logic state stored in bi-stable latch 204 can "read" during a read operation. As shown, the respective gates of first pass transistor 206 and the second pass transistor 208 are coupled to the write line 108.1 and therefore are controlled by the write line voltage WL-1 that is generated by the read assist circuit 100. During read assist for memory cell 202.1, WL-1 is raised to a logic high (e.g. voltage 126 in FIG. 1B) causing the first pass transistor 206 and the second pass transistor 208 to conduct, and therefore enable the logic state stored in bi-stable latch 204 to be read from the bit lines 210.1 and 210.2. The additional memory cells 202.2-202.N have a similar configuration and operate in a similar fashion to memory cells 202.1, as will be understood by those skilled in the arts. It is noted that each of the memory cells 202.1-202.N has its own corresponding write line 108.1-108.N so that the read assistance write line voltages are individually controllable for the corresponding memory cells 202.1-202.N.

Figure 3:
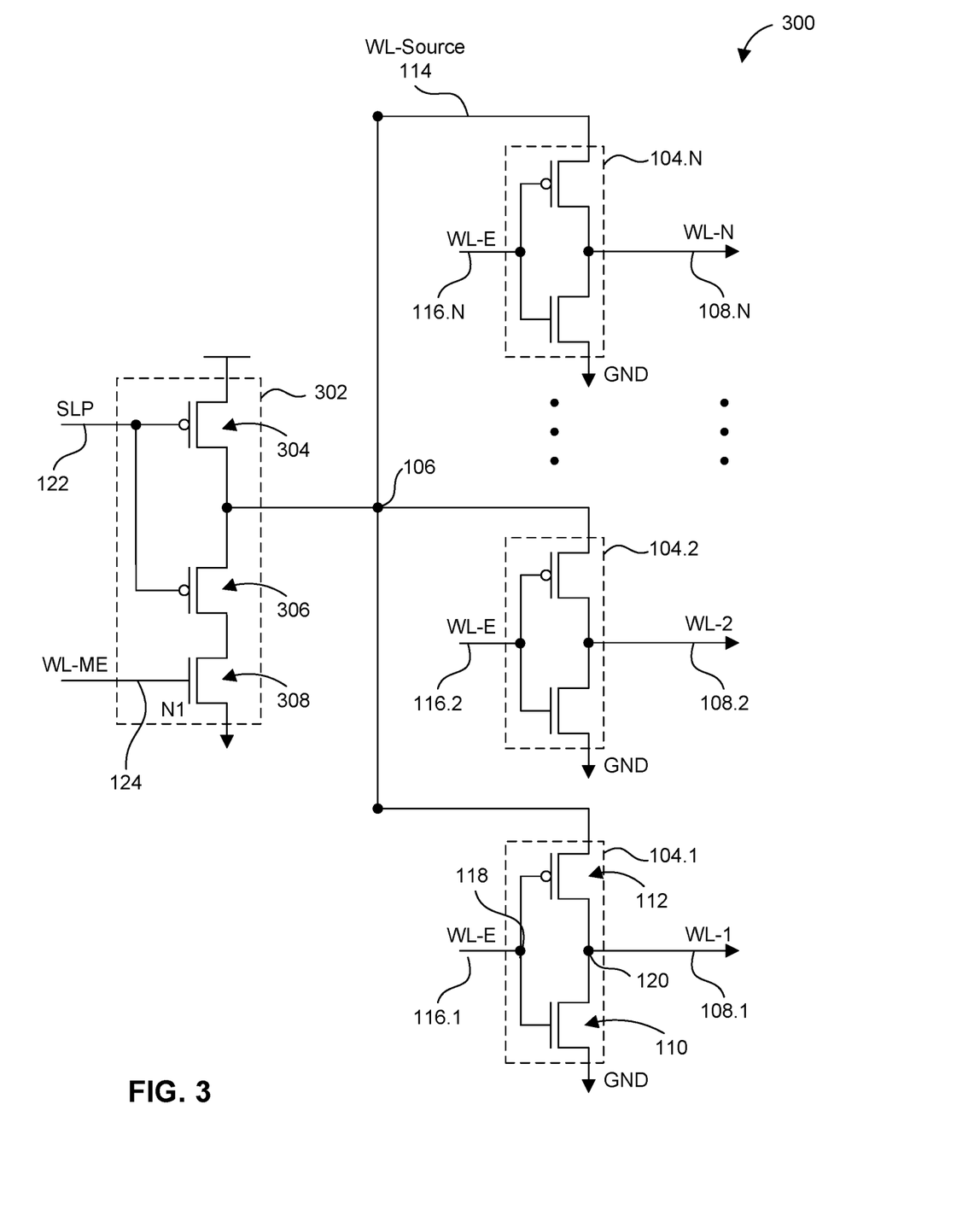
FIG. 3 illustrates a read assist circuit accordingly to a second exemplary embodiment of the disclosure.

FIG. 3 illustrates read assist circuit 300 according to additional embodiments of the disclosure. The read assist circuit 300 generates a number of write line voltages WL-1 to WL-N that can be applied to corresponding write lines of associated memory devices, such as an SRAM device. Read assist circuit 300 is substantially similar to read assist circuit 100, and therefore only the differences between read assist circuit 100 and the read assist circuit 300 will be discussed in detail. For example, read assist circuit 300 includes a voltage divider circuit that includes an NMOS transistor in addition to the cascade connected PMOS transistors described above for read assist circuit 100.

More specifically, read assist circuit 300 includes voltage divider circuit 302 and the number of write line driver circuits 104.1-104.N, which generate the number of write line voltages WL-1 to WL-N. The voltage divider circuit 302 includes PMOS transistors 304 and 306 that are connected in a cascode configuration, similar that of voltage divider circuit 102. Additionally, voltage divider circuit 302 includes an NMOS transistor 308 cascode-connected to the PMOS transistor 306. More specifically, the source of PMOS transistor 306 is connected to the drain of PMOS transistor 304 at node 106. The source of PMOS transistor 304 is connected to the power supply $V_{DD}$ and the drain of PMOS transistor 306 is connected to the drain of the NMOS transistor 308, and the source of NMOS transistor 308 is grounded. Similar to read assist circuit 100, the voltage at node 106 (between PMOS transistors 304 and 306) defines the source write line voltage 114 that can be applied by the individual write line driver circuits 104.1-104.N to their corresponding write lines 108.1-108.N, as shown.

During operation, voltage divider circuit 302 is responsive to two input control signals, namely, sleep control signal 122 and a master enable signal 124; where the PMOS transistors 304 and 306 are controlled by the sleep control signal 122, and the NMOS transistor 308 is controlled by the master enable signal 124. The sleep control signal 122 is generally kept at a logic low so that PMOS transistors 304 and 306 are generally conducting (e.g. "on"), unless the read assist circuit 100 is in a "sleep mode." During "sleep mode," sleep control signal 122 is raised to a "logic high" so that both the PMOS transistors 304 and 306 are cutoff. The master enable signal 124 is set to a logic high to enable read assist for the write lines 108.1-108.N, where the logic high causes the NMOS transistor 308 to conduct (e.g., "on") with minimal resistance so that the drain of PMOS transistor 306 is essentially grounded. Accordingly, when read assist is enabled, the PMOS transistors 304 and 306 operate to voltage-divide the supply voltage $V_{DD}$ according to the relative resistivity of the PMOS transistors 304 and 306, so that the source write line voltage 114 at node 106 is a percentage of the supply voltage $V_{DD}$. The individual write line driver circuits 104.1-104.N can then apply the source write line voltage 114 to their individual write lines 108.1-108.N as selectively controlled by their corresponding individual enable signals 116.1-116.N. The individual write line driver circuits 104.1-104.N are each implemented as inverters, similar to those of read assist circuit 100, and therefore will not be discussed further herein.

Both of the PMOS transistors 304 and 306 in voltage divider 302 are responsive to the same control signal, namely the sleep control signal 122. Accordingly, the PMOS transistors 304 and 306 cycle on/off the same number of times over a given time period, and therefore have a substantially similar aging profile.

Figure 4:
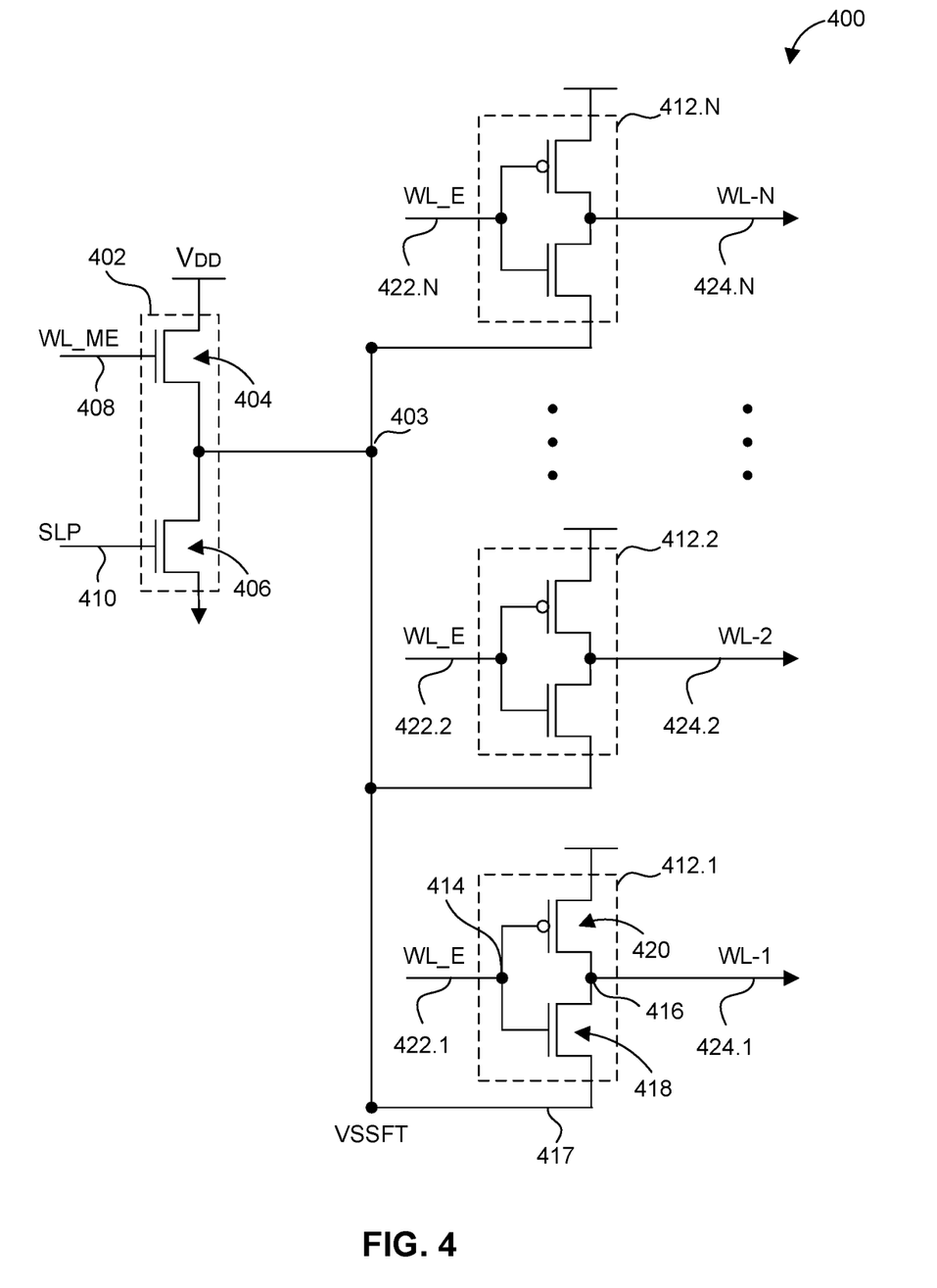
FIG. 4 illustrates a read assist circuit accordingly to a third exemplary embodiment of the disclosure.

FIG. 4 illustrates read assist circuit 400 according to additional embodiments of the disclosure. The read assist circuit 400 generates a number of write line voltages WL-1 to WL-N that can be applied to corresponding write lines of associated memory devices, such as an SRAM device. Read assist circuit 400 operates similar to read assist circuit 100, with the exception that the logic polarities are complementary compared to the read assist circuit 100. Namely, the source write line voltage that is produced by the voltage divider 402 is slightly above ground (illustrated as Vssft), e.g. 5-10% of $V_{DD}$. This arrangement is consistent with a pass transistor (e.g. pass transistor 206) being a PMOS transistor, instead of an NMOS transistor as will be explained.

Read assist circuit 400 includes voltage divider circuit 402 and a number of write line driver circuits 412.1-412.N, which generate the number of write line voltages WL-1 to WL-N. The voltage divider circuit 402 includes NMOS transistors 404 and 406 that are connected in a cascode configuration. More specifically, the source of NMOS transistor 404 is connected to the drain of NMOS transistor 406 at node 403. The drain of NMOS transistor 404 is connected to the power supply $V_{DD}$ and the source of NMOS transistor 406 is connected to ground. The voltage at node 403 (between NMOS transistors 404 and 406) defines the source write line voltage 417 that is available to be applied by the individual write line driver circuits 412.1-412.N to their corresponding write lines 424.1-424.N, as shown. The individual write line driver circuits 412.1-412.N are each implemented as inverters. For example, write line driver circuit 412.1 includes an NMOS transistor 418 that is cascode-connected with PMOS transistor 420 to provide the inverter configuration.

During operation, voltage divider circuit 402 is responsive to two input control signals, namely, a sleep control signal 410 and a master enable signal 408. The sleep control signal 410 is generally kept at a logic high so that NMOS transistor 406 is generally conducting (e.g. "on"), unless the read assist circuit 400 is in a "sleep mode". During "sleep mode," sleep control signal 410 is set to a logic low so that NMOS transistor 406 is cutoff. The master enable signal 408 is set to a logic high to enable read assist for the write lines 424.1-424.N, where the logic high causes the NMOS transistor 404 to conduct (e.g., "on"). When read assist is enabled (and sleep mode is off), the NMOS transistors 404 and 406 operate to voltage-divide the supply voltage $V_{DD}$ according to the relative resistivity of the NMOS transistors 404 and 406, so that the source write line voltage 417 at node 403 is slightly above ground (e.g. 5-10% of $V_{DD}$). The individual write line driver circuits 412.1-412.N then selectively apply the source write line voltage 417 to their individual write lines 424.1-424.N as controlled by their corresponding individual enable signals 422.1-422.N.

Write line driver circuits 412.1-412.N are implemented as inverters, responsive to corresponding individual enable signals 422.1-422.N as shown. Accordingly, the read assist is individually controllable for each memory cell that can be attached to the corresponding write lines 424.1-424.N. Write line driver circuit 412.1, for example, includes an input 414 and an output 416, where the input 414 receives the individual enable signal 422.1, and the output 416 is connected to the write line 424.1 to provide a read assist write line voltage WL-1 to a corresponding memory cell attached to write line 424.1. The read assist is activated for the corresponding memory cell attached to write line 424.1 when the individual enable signal 422.1 is a logic high, which is inverted by the inverter 412.1 to provide a logic low at the output 416, which is consistent with an PMOS pass transistor. The logic low voltage at the output 416 is supplied by the source write line voltage 417 that was generated by the voltage divider circuit 402 as described above. More specifically, when the individual enable signal 422.1 is a logic high, then the NMOS transistor 418 conducts to apply the source write line voltage 417 to the output 416 and correspondingly to the write line 424.1. Additionally, the PMOS transistor 420 is cutoff when the enable signal 422.1 is a logic high to isolate the output 416 from $V_{DD}$. When the individual enable signal 422.1 is logic low, then NMOS transistor 418 is cutoff, so that the source write line voltage 417 is isolated from output node 416, and PMOS transistor 420 is conducting to raise the output 416 to $V_{DD}$ and therefore disable read assistance. The additional driver circuits 412.2-412.N have a similar configuration and operate in a similar fashion to the driver circuit 412.1, as will be understood by those skilled in the arts.

As indicated above, the voltage divider circuit 402 defines the source write line voltage 417 that is applied to the individual write line driver circuits 412.1-412.N, where the source write line voltage 417 is a percentage of the supply voltage $V_{DD}$. In example embodiments of the disclosure, the source write line voltage 417 has a magnitude that is slightly above ground, e.g. 5-10% of the supply voltage $V_{DD}$. As discussed above, the relative value of the source write line voltage 417 to the supply voltage $V_{DD}$ is determined by the relative resistivity of the NMOS transistors 404 and 406. Accordingly, the NMOS transistor 404 can be sized to be smaller than the NMOS transistor 406 so that most (e.g. 90-95%) of the voltage drop from $V_{DD}$ to ground occurs across NMOS transistor 404 when read assist is in operation.

Figure 5:
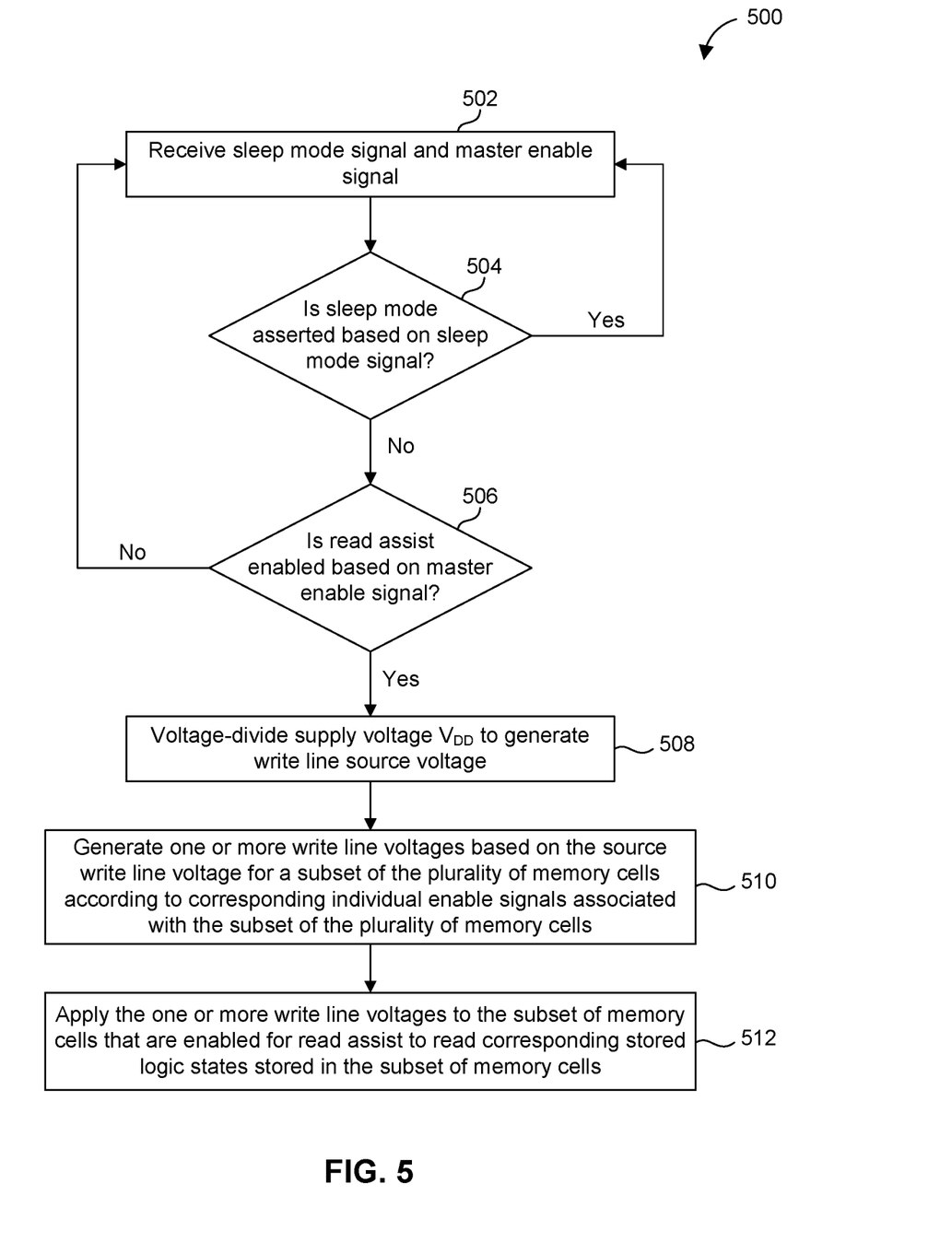
FIG. 5 illustrates a flowchart of an exemplary operation for providing read assistance to a subset of memory cells.

FIG. 5 illustrates a flowchart 500 of an exemplary operation for providing read assist write line voltages according to embodiments of the present disclosure. The flowchart 500 makes reference to the read assist circuit 100 in FIG. 1A and the memory system 200 in FIG. 2 for example purposes only. The disclosure is not limited to this operational description or its application to read assist circuit 100 or the memory system 200. Rather, it will be apparent to persons of ordinary skill in the relevant art(s) that other operational control flows, systems, and applications are within the scope and spirit of the present disclosure.

At operation 502, a sleep control signal and a master enable signal are received. For example, the voltage divider circuit 102 can receive the sleep control signal 122 and a master enable signal 124.

At operation 504, a determination is made whether sleep mode is asserted based on the sleep control signal. If "yes", then the control returns back to step 502. If no, then control flows to step 506. For example, PMOS transistor 105 is cutoff when the sleep control signal 122 is a logic high to implement sleep mode, and conducts when the sleep control signal is a logic low.

At operation 506, a determination is made whether the read assist is enabled based on the master enable signal. If "yes", then control flows to step 508. If "no", then control flows back to step 502. For example, PMOS transistor 103 conducts when the master enable signal 124 is a logic low to enable read assist for a number of memory cells, and is cutoff when the master enable signal is a logic high to disable read assist.

At operation 508, a supply voltage $V_{DD}$ is voltage-divided to generate a source write line voltage that is a percentage of the supply voltage $V_{DD}$. For example, the voltage divider circuit 102 can voltage divide the supply voltage $V_{DD}$ based on the relative resistivity of the PMOS transistors 103 and 105 to generate the source write line voltage 114, where the source write line voltage 114 can be 90-95% of the supply voltage $V_{DD}$ in embodiments of the disclosure.

At operation 510, one or more write line voltages are generated based on the source write line voltage for a subset of the number of memory cells according to corresponding individual enable signals associated with the subset of the number of memory cells. For example, write driver circuits 104.1-104.N selectively apply the source write line voltage 114 to corresponding write lines 108.1-108.N as controlled by their individual enable signals 116.1-116.N. Accordingly, the source write line voltage 114 can be selectively applied to a subset, or all, of the write lines 108.1-108.N to provide the one or more write line voltages for read assist to the corresponding memory cells.

At operation 512, one or more read assist write line voltages are applied to the subset of memory cells that are enabled for read assist to read corresponding stored logic states stored in the subset of memory cells during a read operation. For example, the write line voltage WL-1 can be selectively applied to pass transistors 206 and 208 of the memory cell 202.1, where the read assistance enablement is determine by the individual enable signal 116.1. Additional write lines voltages WL-2 through WL-N can be selectively applied to their corresponding memory cells 202.2-202.N as determined by their individual enable signals 116.2-116.N.

Figure 6:
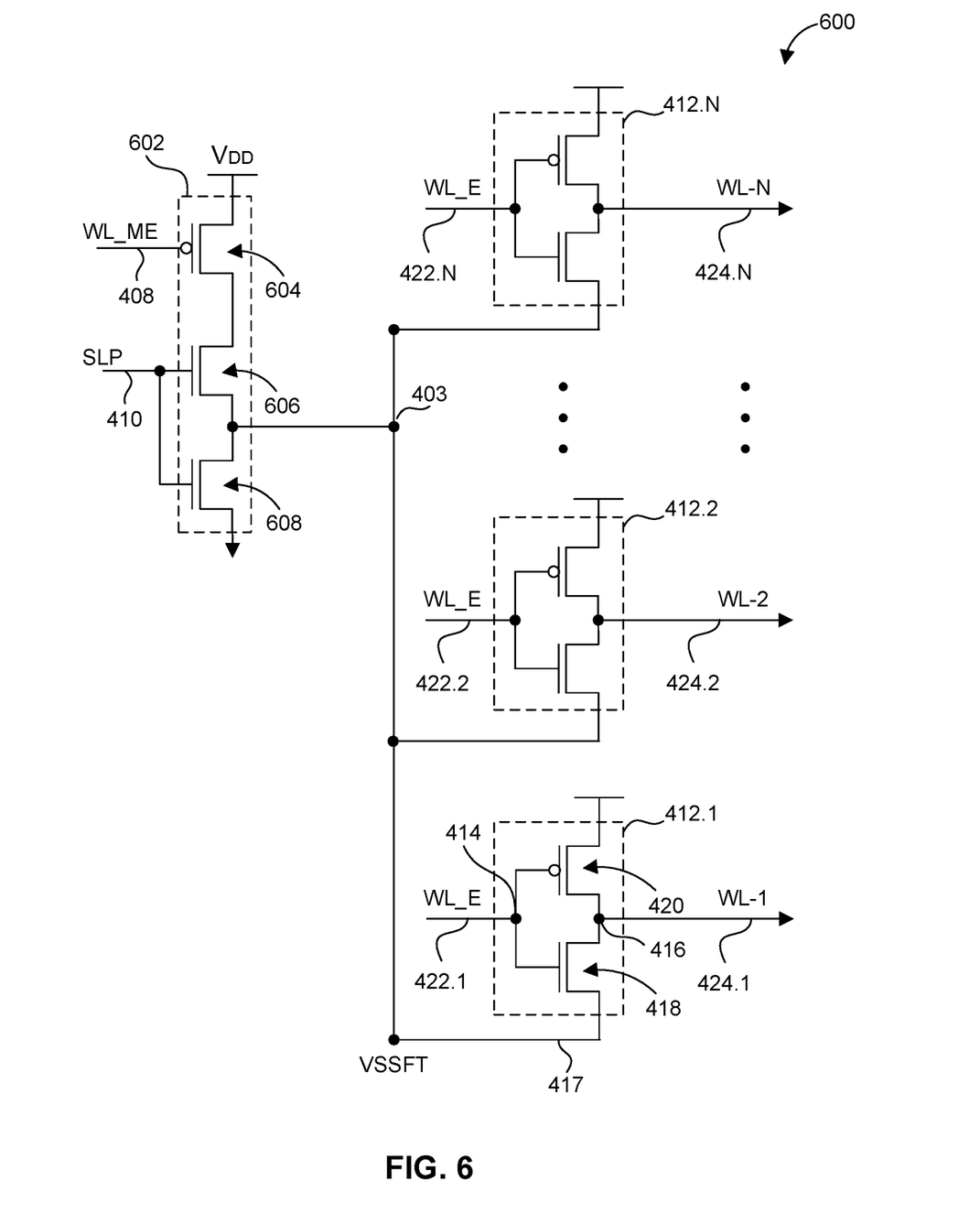
FIG. 6 illustrates a read assist circuit accordingly to a fourth exemplary embodiment of the disclosure.

FIG. 6 illustrates read assist circuit 600 according to additional embodiments of the disclosure. The read assist circuit 600 generates a number of write line voltages WL-1 to WL-N that can be applied to corresponding write lines of associated memory devices, such as an SRAM device. Read assist circuit 600 is substantially similar to read assist circuit 400, and therefore only the differences between read assist circuit 600 and the read assist circuit 400 will be discussed in detail. For example, read assist circuit 600 includes a voltage divider circuit that includes a PMOS transistor in addition to the cascade connected NMOS transistors described above for read assist circuit 400.

More specifically, read assist circuit 600 includes voltage divider circuit 602 and the number of write line driver circuits 412.1-412.N, which generate the number of write line voltages WL-1 to WL-N. The voltage divider circuit 602 includes NMOS transistors 606 and 608 that are connected in a cascode configuration, similar that of voltage divider circuit 402. Additionally, voltage divider circuit 602 includes a PMOS transistor 604 cascode-connected to the NMOS transistor 606. More specifically, the source of NMOS transistor 606 is connected to the drain of NMOS transistor 608 at node 403. The source of NMOS transistor 608 is grounded, the drain of NMOS transistor 606 is connected to the drain of PMOS transistor 604, and the source of PMOS transistor 604 is connected to the power supply $V_{DD}$. Similar to read assist circuit 400, the voltage at node 403 (between NMOS transistors 606 and 608) defines the source write line voltage 417 that can be applied by the individual write line driver circuits 412.1-412.N to their corresponding write lines 424.1-424.N, as shown.

During operation, voltage divider circuit 602 is responsive to two input control signals, namely, sleep control signal 410 and a master enable signal 408; where the NMOS transistors 606 and 608 are controlled by the sleep control signal 410, and the PMOS transistor 604 is controlled by the master enable signal 408. The sleep control signal 410 is generally kept at a logic high so that NMOS transistors 606 and 608 are generally conducting (e.g. "on"), unless the read assist circuit 600 is in a "sleep mode." During "sleep mode," sleep control signal 410 is changed to a "logic low" so that both the NMOS transistors 606 and 608 are cutoff. The master enable signal 408 is set to a logic low to enable read assist for the write lines 424.1-424.N, where the logic low causes the PMOS transistor 604 to conduct (e.g., "on") with minimal resistance so that the drain of NMOS transistor 606 is essentially connected to the power supply $V_{DD}$. Accordingly, when read assist is enabled, the NMOS transistors 606 and 608 operate to voltage-divide the supply voltage $V_{DD}$ according to the relative resistivity of the NMOS transistors 606 and 608, so that the source write line voltage 417 at node 403 is a percentage of the supply voltage $V_{DD}$. The individual write line driver circuits 412.1-412.N can then apply the source write line voltage 417 to their individual write lines 424.1-424.N as selectively controlled by their corresponding individual enable signals 422.1-422.N. The individual write line driver circuits 412.1-412.N are each implemented as inverters, as described for read assist circuit 400, and therefore will not be discussed further herein.

CONCLUSION

The foregoing Detailed Description discloses a read assist circuit including a voltage divider circuit and a number of write line driver circuits. The voltage divider circuit operates to voltage-divide a power supply voltage and provide a source write line voltage at an output of the voltage divider circuit to the number of write line driver circuits. Each write line driver circuit receives the source write line voltage and selectively applies the source write line voltage to a corresponding write line according to a corresponding individual enable signal that controls each write driver circuit. Further, each write line driver circuit is coupled to a corresponding memory cell of a number of memory cells via the corresponding write line so that the corresponding write line provides a corresponding write line voltage to control a pass transistor during a read operation of the corresponding memory cell.

The foregoing Detailed Description also discloses a memory system including a number of memory cells and a read assist circuit. Each memory cell includes a bi-stable latch that stores a logic state and a pass transistor coupled between the bi-stable latch and a bit line, where the pass transistor operates to selectively output the logic state to the bit line responsive to a write line voltage that controls the pass transistor. The read assist circuit provides a number of write line voltages on a number of write lines, where each write line connected to a gate of a corresponding pass transistor of a corresponding memory cell of the number of memory cells. The read assist circuit includes a voltage divider circuit that is responsive to a master enable signal, and voltage-divides a power supply voltage and provide a source write line voltage at an output of the voltage divider circuit responsive to read assist being enabled by the master enable signal. The voltage divider circuit further includes a number of write line driver circuits corresponding to the number of memory cells, where each write line driver circuit receives the source write line voltage and selectively applies the source write line voltage to a corresponding write line of the number of write lines according to a corresponding individual enable signal that controls each write driver circuit.

The foregoing Detailed Description further discloses a method for providing read assistance during a read operation to a number of memory cells. The method includes receiving a master enable signal and determining whether the master enable signal indicates read assistance is available for the number of memory cells. The method further includes voltage dividing a power supply voltage to generate a source write line voltage responsive to determining that read assistance is available for the number of memory cells, and generating one or more write line voltages based on the source write line voltage for a subset of the number of memory cells according to corresponding individual enable signals associated with the subset of the number of memory cells. Additionally, the method further includes applying the one or more write line voltages to the subset of the number of memory cells that are enabled for read assistance during the read operation based on the corresponding individual enable signals.

The foregoing Detailed Description referred to accompanying figures to illustrate exemplary embodiments consistent with the disclosure. References in the foregoing Detailed Description to "an exemplary embodiment" indicates that the exemplary embodiment described can include a particular feature, structure, or characteristic, but every exemplary embodiment may not necessarily include the particular feature, structure, or characteristic. Moreover, such phrases are not necessarily referring to the same exemplary embodiment. Further, any feature, structure, or characteristic described in connection with an exemplary embodiment can be included, independently or in any combination, with features, structures, or characteristics of other exemplary embodiments whether or not explicitly described.

The foregoing Detailed Description is not meant to limiting. Rather, the scope of the disclosure is defined only in accordance with the following claims and their equivalents. It is to be appreciated that the foregoing Detailed Description, and not the following Abstract section, is intended to be used to interpret the claims. The Abstract section can set forth one or more, but not all exemplary embodiments, of the disclosure, and thus, is not intended to limit the disclosure and the following claims and their equivalents in any way.

The exemplary embodiments described within foregoing Detailed Description have been provided for illustrative purposes, and are not intended to be limiting. Other exemplary embodiments are possible, and modifications can be made to the exemplary embodiments while remaining within the spirit and scope of the disclosure. The foregoing Detailed Description has been described with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

Embodiments of the disclosure can be implemented in hardware, firmware, software, or any combination thereof. Embodiments of the disclosure can also be implemented as instructions stored on a machine-readable medium, which can be read and executed by one or more processors. A machine-readable medium can include any mechanism for storing or transmitting information in a form readable by a machine (e.g., a computing circuitry). For example, a machine-readable medium can include non-transitory machine-readable mediums such as read only memory (ROM); random access memory (RAM); magnetic disk storage media; optical storage media; flash memory devices; and others. As another example, the machine-readable medium can include transitory machine-readable medium such as electrical, optical, acoustical, or other forms of propagated signals (e.g., carrier waves, infrared signals, digital signals, etc.). Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

The foregoing Detailed Description fully revealed the general nature of the disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and number of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

What is claimed is:

1. A read assist circuit, comprising:
a voltage divider circuit configured to voltage-divide a power supply voltage and provide a source write line voltage at an output of the voltage divider circuit; and
a plurality of write line driver circuits, each write line driver circuit configured to receive the source write line voltage and selectively apply the source write line voltage to a corresponding write line according to a corresponding individual enable signal that controls the each write driver circuit,
wherein the voltage divider circuit includes a first transistor and a second transistor that are cascode-connected to form a node that provides the source write line voltage, and
wherein the source write line voltage is a percentage of the power supply voltage, the percentage determined by a ratio of a first resistance of the first transistor compared to a second resistance of the second transistor.

2. The read assist circuit of claim 1, wherein:
the first transistor includes a source connected to the power supply voltage; and
the second transistor includes a source connected to a drain of the first transistor at the node that provides the source write line voltage, and a drain that is connected to ground.

3. The read assist circuit of claim 1, wherein the first transistor includes a first gate that receives a first control signal and the second transistor includes a second gate that receives a second control signal, wherein the first control signal and the second control signal collectively control generation of the source write line voltage by the voltage divider circuit.

4. The read assist circuit of claim 3, wherein the first control signal indicates a sleep mode and cuts off the first transistor responsive to the sleep mode being activated so as to disable generation of the source write line voltage.

5. The read assist circuit of claim 3, wherein the second control signal is a master enable signal that enables generation of the source write line voltage responsive to read assist being activated and sleep mode being deactivated.

6. The read assist circuit of claim 1, wherein the voltage divider circuit includes:
a third transistor having a drain that is connected to a drain of the second transistor, and having a source connected to ground.

7. The read assist circuit of claim 6, wherein the first transistor and the second transistor include respective gates controlled by a same sleep mode signal, and the third transistor includes a gate controlled by a master enable signal for the read assist circuit.

8. The read assist circuit of claim 1, wherein the each write line driver circuit is configured to invert the corresponding individual enable signal received at an input of the each write line driver circuit to provide a corresponding write line voltage on the corresponding write line at an output of the each write line driver circuit.

9. The read assist circuit of claim 8, wherein the corresponding write line voltage is sourced by the source write line voltage responsive to the corresponding individual enable signal being a logic low.

10. The read assist circuit of claim 8, wherein the each write line driver circuit includes:
a PMOS transistor having a source connected to the output of the voltage divider circuit to receive the source write line voltage; and
an NMOS transistor having a drain connected to the drain of the PMOS transistor at the output of the each write line driver circuit,
wherein respective gates of the PMOS transistor and the NMOS transistor are connected together at the input of the each write line driver circuit to receive the corresponding individual enable signal.

11. The read assist circuit of claim 1, wherein:
the each write line driver circuit is coupled to a corresponding memory cell of a plurality of memory cells via the corresponding write line; and
the corresponding write line providing a corresponding write line voltage to control a pass transistor during a read operation of the corresponding memory cell.

12. A memory system, comprising:
a plurality memory cells, each memory cell including:
a bi-stable latch that stores a logic state; and
a pass transistor coupled between the bi-stable latch and a bit line, wherein the pass transistor is configured to selectively output the logic state to the bit line responsive to a write line voltage that controls the pass transistor; and
a read assist circuit configured to provide a plurality of write line voltages on a plurality of write lines, each write line connected to a gate of a corresponding pass transistor of a corresponding memory cell of the plurality of memory cells, the read assist circuit including:
a voltage divider circuit, responsive to a master enable signal, and configured to voltage-divide a power supply voltage and provide a source write line voltage at an output of the voltage divider circuit responsive to read assist being enabled by the master enable signal; and
a plurality of write line driver circuits corresponding to the plurality of memory cells, each write line driver circuit configured to receive the source write line voltage and selectively apply the source write line voltage to a corresponding write line of the plurality of write lines according to a corresponding individual enable signal that controls the each write line driver circuit.

13. The memory system of claim 12, wherein the voltage divider circuit includes a first PMOS transistor and a second PMOS transistor that are cascode-connected to form a node that provides the source write line voltage.

14. The memory system of claim 13, wherein the source write line voltage is a percentage of the power supply voltage, the percentage determined by ratio of a first resistance of the first PMOS transistor compared to a second resistance of the second PMOS transistor, and wherein the second PMOS transistor is sized smaller than the first PMOS transistor so that the percentage of the power supply voltage is greater than 90% of the power supply voltage.

15. The memory system of claim 13, wherein the first PMOS transistor includes a first gate that receives a first control signal and the second PMOS transistor includes a second gate that receives a second control signal, wherein the first control signal and the second control signal collectively control generation of the source write line voltage by the voltage divider circuit.

16. The memory system of claim 15, wherein:
the first control signal indicates a sleep mode and cuts off the first PMOS transistor responsive to the sleep mode being activated so as to disable generation of the source write line voltage; and
the second control signal is a master enable signal that enables generation of the source write line voltage responsive to read assist being activated and sleep mode being deactivated.

17. A method of providing read assistance during a read operation to a plurality of memory cells, the method comprising:

receiving a master enable signal;
determining whether the master enable signal indicates read assistance is available for the plurality of memory cells;
voltage dividing a power supply voltage to generate a source write line voltage responsive to determining that read assistance is available for the plurality of memory cells;
generating one or more write line voltages based on the source write line voltage for a subset of the plurality of memory cells according to corresponding individual enable signals associated with the subset of the plurality of memory cells; and
applying the one or more write line voltages to the subset of the plurality of memory cells that are enabled for read assistance during the read operation based on the corresponding individual enable signals,
wherein the source write line voltage is a percentage of the power supply voltage, the percentage determined by a ratio of a first resistance of a first transistor compared to a second resistance of a second transistor of a voltage divider circuit that performs the voltage dividing.

18. The method of claim 17, wherein the generating comprises:
selectively applying the source write line voltage to one or more write lines according to the corresponding individual enable signals, wherein each write line of the one or more write lines controls the read operation of a memory cell of the subset of the plurality of memory cells.

19. The read assist circuit of claim 1, wherein the voltage divider circuit includes:
a third transistor having a drain that is connected to a drain of the first transistor, and having a source connected to the power supply voltage.

20. The memory system of claim 12, wherein the voltage divider circuit includes:
a first PMOS transistor and a second PMOS transistor that are cascode-connected to form a node that provides the source write line voltage; and
an NMOS transistor having a drain that is connected to a drain of the second PMOS transistor, and having a source connected to ground.

21. The memory system of claim 12, wherein the voltage divider circuit includes:
a first NMOS transistor and a second NMOS transistor that are cascode-connected to form a node that provides the source write line voltage; and
a PMOS transistor having a drain that is connected to a drain of the first NMOS transistor, and having a source connected to the power supply voltage.

* * * * *